United States Patent
Blin

(10) Patent No.: US 11,296,688 B2
(45) Date of Patent: Apr. 5, 2022

(54) SWITCHING TIME REDUCTION OF AN RF SWITCH

(71) Applicant: SKYWORKS SOLUTIONS, INC., Irvine, CA (US)

(72) Inventor: Guillaume Alexandre Blin, Carlisle, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 17/122,159

(22) Filed: Dec. 15, 2020

(65) Prior Publication Data

US 2021/0194476 A1 Jun. 24, 2021

Related U.S. Application Data

(60) Provisional application No. 62/949,759, filed on Dec. 18, 2019.

(51) Int. Cl.

| H03K 17/04 | (2006.01) |
|---|---|
| H03K 17/042 | (2006.01) |
| H03H 11/02 | (2006.01) |
| H04B 1/48 | (2006.01) |

(52) U.S. Cl.
CPC ....... *H03K 17/04206* (2013.01); *H03H 11/02* (2013.01); *H03K 17/0406* (2013.01); *H04B 1/48* (2013.01)

(58) Field of Classification Search
CPC ......... H03K 17/04206; H03K 17/0406; H03K 17/693; H03K 17/04106; H03K 17/0412; H03K 17/161; H04B 1/44; H04B 1/48; H03H 11/28; H03H 11/02

See application file for complete search history.

(56) References Cited

U.S. PATENT DOCUMENTS

| 8,334,718 | B2 | 12/2012 | Granger-Jones et al. |
|---|---|---|---|
| 8,461,903 | B1 | 6/2013 | Granger-Jones |
| 9,143,124 | B2 | 9/2015 | Cam et al. |
| 9,438,223 | B2 | 9/2016 | de Jongh |
| 9,742,400 | B2 * | 8/2017 | Bakalski .............. H03K 17/693 |
| 9,899,988 | B2 | 2/2018 | Yu et al. |
| 10,505,530 | B2 | 12/2019 | Ranta et al. |
| 10,608,623 | B2 | 3/2020 | Kerr et al. |
| 2013/0278317 | A1 | 10/2013 | Iversen et al. |
| 2014/0118053 | A1 | 5/2014 | Matsuno |
| 2014/0266415 | A1 | 9/2014 | Kerr et al. |
| 2016/0329891 | A1 | 11/2016 | Bakalski et al. |
| 2017/0201245 | A1 | 7/2017 | Scott et al. |
| 2018/0114801 | A1 | 4/2018 | Leipold et al. |
| 2021/0203322 | A1 | 7/2021 | Blin |

* cited by examiner

*Primary Examiner* — Jung Kim
(74) *Attorney, Agent, or Firm* — Lando & Anastasi, LLP

(57) ABSTRACT

A switch for a radio frequency signal switch assembly including a first node coupled to one of an input and an output of the switch assembly and a second node coupled to a reference voltage, a control node, a common resistor coupled to the control node, a plurality of transistors coupled between the first and second nodes, each transistor of the plurality of transistors having a gate, a drain, and a source, and a plurality of gate resistors coupled between the common resistor and the gates of the plurality of transistors, the plurality of gate resistors having a scaled arrangement of values selected based on a voltage differential across each of the plurality of gate resistors to improve switching speed.

20 Claims, 9 Drawing Sheets

SWITCHING TIME REDUCTION OF AN RF SWITCH

CROSS-REFERENCE TO RELATED APPLICATIONS

This application claims priority under 35 U.S.C. § 119(e) to U.S. Provisional Patent Application Ser. No. 62/949,759, titled SWITCHING TIME REDUCTION OF AN RF SWITCH, filed Dec. 18, 2019, which is incorporated herein by reference for all purposes.

BACKGROUND

Wireless communication devices commonly use one or more instances of transmit and receive circuitry to generate and amplify transmit signals and to amplify and process receive signals, respectively. One or more antennas in such wireless communication devices are typically connected to transmit and receive circuitry through one or more radio-frequency (RF) switches, sometimes referred to as "transmit/receive switches" or "antenna switches." In addition, RF switches may be included in antenna tuning circuitry connected to the one or more antennas and operated to tune the one or more antennas to different frequencies or frequency bands. During operation, such RF switches must be capable of meeting stringent performance requirements for switching and settling times. Conventional approaches for reducing the switching/settling times of such RF switches can often degrade isolation performance of the RF switch.

SUMMARY OF THE INVENTION

At least one aspect of the present disclosure is directed to a switch for a radio frequency signal switch assembly. The switch includes a first node coupled to one of an input and an output of the switch assembly and a second node coupled to a reference voltage, a control node, a common resistor coupled to the control node, a plurality of transistors coupled between the first and second nodes, each transistor of the plurality of transistors having a gate, a drain, and a source, and a plurality of gate resistors coupled between the common resistor and the gates of the plurality of transistors, the plurality of gate resistors having a scaled arrangement of values selected based on a voltage differential across each of the plurality of gate resistors to improve switching speed.

In one embodiment, a control signal received by the control node is applied to the gates of the plurality of transistors through the common resistor and the plurality of gate resistors. In some embodiments, the control signal is configured to operate the switch in an on state by turning on each of the plurality of transistors such that an RF signal received at the first node is provided to the second node. In various embodiments, the control signal is configured to operate the switch in an off state by turning off each of the plurality of transistors such that the RF signal received at the first node is not provided to the second node.

In some embodiments, the switch includes a plurality of drain-source resistors, each drain-source resistor being coupled between the drain and source of a corresponding transistor of the plurality of transistors. In one embodiment, the voltage differential across each of the plurality of gate resistors is based on a voltage distribution of the RF signal received at the first node during the off state, the voltage distribution being determined, at least in part, by the plurality of gate resistors and the plurality of drain resistors. In certain embodiments, the values of the gate resistors corresponding to the lowest voltage differentials are smaller than the values of the gate resistors corresponding to highest voltage differentials.

In various embodiments, a first gate resistor of the plurality of gate resistors corresponding to the lowest voltage differential has a smaller value than the other gate resistors of the plurality of gate resistors. In one embodiment, a first transistor of the plurality of transistors corresponding to the first gate resistor turns on and/or off faster than at least one second transistor of the plurality of transistors. In some embodiments, the first transistor turning on and/or off faster than the at least one second transistor allows the at least one second transistor to turn on and/or off faster to improve the switching speed of the switch.

Another aspect of the present disclosure is directed to a radio frequency signal switch assembly including a signal input and a signal output, a reference node configured to be coupled to a reference voltage, a control input configured to receive a control signal, a common resistor coupled to the control input, a first switch including a first plurality of transistors coupled between the signal input and the signal output, each transistor of the plurality of first transistors having a gate, a drain, and a source, a second switch including a second plurality of transistors coupled between the reference node and one of the signal input and the signal output, each transistor of the plurality of second transistors having a gate, a drain, and a source, and a plurality of gate resistors coupled between the common resistor and the gates of the second plurality of transistors, the plurality of gate resistors having a scaled arrangement of values selected based on a voltage differential across each of the plurality of gate resistors to improve switching speed.

In one embodiment, the control signal received at the control input is applied to the gates of the second plurality of transistors through the common resistor and the plurality of gate resistors. In some embodiments, the control signal is configured to operate the switch assembly in an on state by turning off the second plurality of transistors of the second switch such that an RF signal received at one of the signal input and the signal output is not provided to the reference node while the first plurality of transistors of the first switch are turned on. In various embodiments, the control signal is configured to operate the switch assembly in an off state by turning on the second plurality of transistors of the second switch such that an RF signal received at one of the signal input and the signal output is provided to the reference node while the first plurality of transistors of the first switch are turned off.

In some embodiments, the switch assembly includes a plurality of drain-source resistors, each drain-source resistor being coupled between the drain and source of a corresponding transistor of the second plurality of transistors. In one embodiment, the voltage differential across each of the plurality of gate resistors is based on a voltage distribution of the RF signal received at one of the signal input and the signal output during the on state of the switch assembly, the voltage distribution being determined, at least in part, by the plurality of gate resistors and the plurality of drain-source resistors. In certain embodiments, a first gate resistor of the plurality of gate resistors corresponding to the lowest voltage differential has a smaller value than the other gate resistors of the plurality of gate resistors. In various embodiments, a first transistor of the second plurality of transistors corresponding to the first gate resistor turns on and/or off faster than at least one second transistor of the second plurality of transistors.

Another aspect of the present disclosure is directed to a method of designing a switch for a radio frequency signal switch assembly. The method includes arranging a plurality of transistors between a first node coupled to one of an input and an output of the switch assembly and a second node coupled to a reference voltage, each transistor of the plurality of transistors having a gate, a drain, and a source, selecting a common resistor to be coupled to a control node, and selecting a plurality of gate resistors to be coupled between the common resistor and the gates of the plurality of transistors, the plurality of gate resistors having a scaled arrangement of values selected based on a voltage differential across each of the plurality of gate resistors to improve switching speed.

In one embodiment, selecting the plurality of gate resistors based on the voltage differential across each of the plurality of gate resistors includes determining a voltage distribution of an RF signal received at the first node and scaling the plurality of gate resistors based on the voltage distribution of the RF signal.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures may be represented by a like numeral. For purposes of clarity, not every component may be labeled in every figure. In the figures.

DETAILED DESCRIPTION

Aspects and examples are directed to RF switch assemblies and components thereof, and to devices, modules, and systems incorporating the same.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

As discussed above, wireless communication devices often include one or more RF switches to couple transmit and receive circuity to one or more antennas, and/or to couple the one or more antennas to antenna tuning circuitry. For example, RF switches may be configured to provide transmit signals from transmit circuitry to an antenna, to provide signals received by an antenna to receive circuitry, or to couple an antenna to antenna tuning circuitry. In some examples, the RF switches may be included within antenna tuning circuitry and may be configured to connect and disconnect various combinations of capacitors and inductors to the antenna for tuning purposes. In some examples, such RF switches may be transistor-based switches. In certain examples, such RF switches may include multiple transistor-based switches and the transistor-based switches may be assembled or arranged to provide an RF switch having a desired number of inputs (e.g., poles) and outputs (e.g., throws).

Figure 1A:
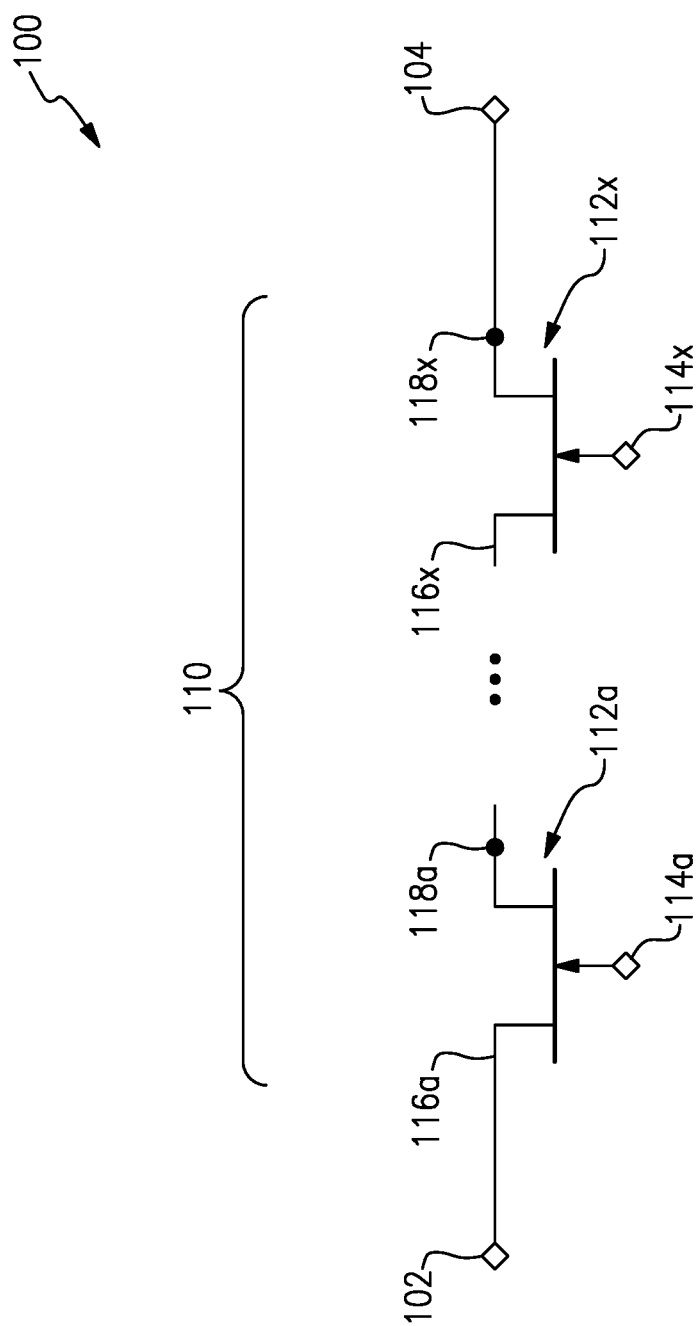
FIG. 1A is a schematic diagram of an example of a transistor-based switch assembly.

FIG. 1A illustrates one example of a transistor-based signal switch assembly 100 having a signal input 102 and a signal output 104 and including a series switch 110 coupled between the signal input 102 and the signal output 104. In various examples, the signal input 102 and the signal output 104 may be reversible without affecting the component, e.g., the switch 100.

In one example, the series switch 110 includes a plurality of series FETs 112 coupled between the signal input 102 and the signal output 104. Each FET of the plurality of series FETs 112 may have a gate 114, a drain 116, and a source 118. In certain examples, each FET may also have a body contact (not shown). In some examples, the plurality of series FETs 112 includes a first FET 112a having a drain 116a coupled to the signal input 102 and a last FET 112x having a source 118x coupled to the signal output 104. In other examples, the plurality of series FETs 112 may be arranged differently, for example, the source 118a of the first FET 112a may be coupled to the signal input 102 and the drain 116x of the last FET 112x may be coupled to the signal output 104. In some examples, the plurality of series FETs 112 may include additional FETs coupled in series between the first FET 112a and the last FET 112x.

In one example, a control voltage applied to, and received at, the gate 114 of each FET of the plurality of series FETs 112 controls the conductivity of a channel between the drain 116 and the source 118 of each FET. In some examples, the gates 114 of the plurality of series FETs 112 may be coupled to one another and configured to receive the same control voltage, such that the plurality of series FETs 112 may be controlled in unison. In one example, the switch 100 may be operated in an "on state" by controlling the plurality of series FETs 112 to be conducting (on) and in the "off state" by controlling the plurality of series FETs 112 to be non-conducting (off).

Figure 1B:
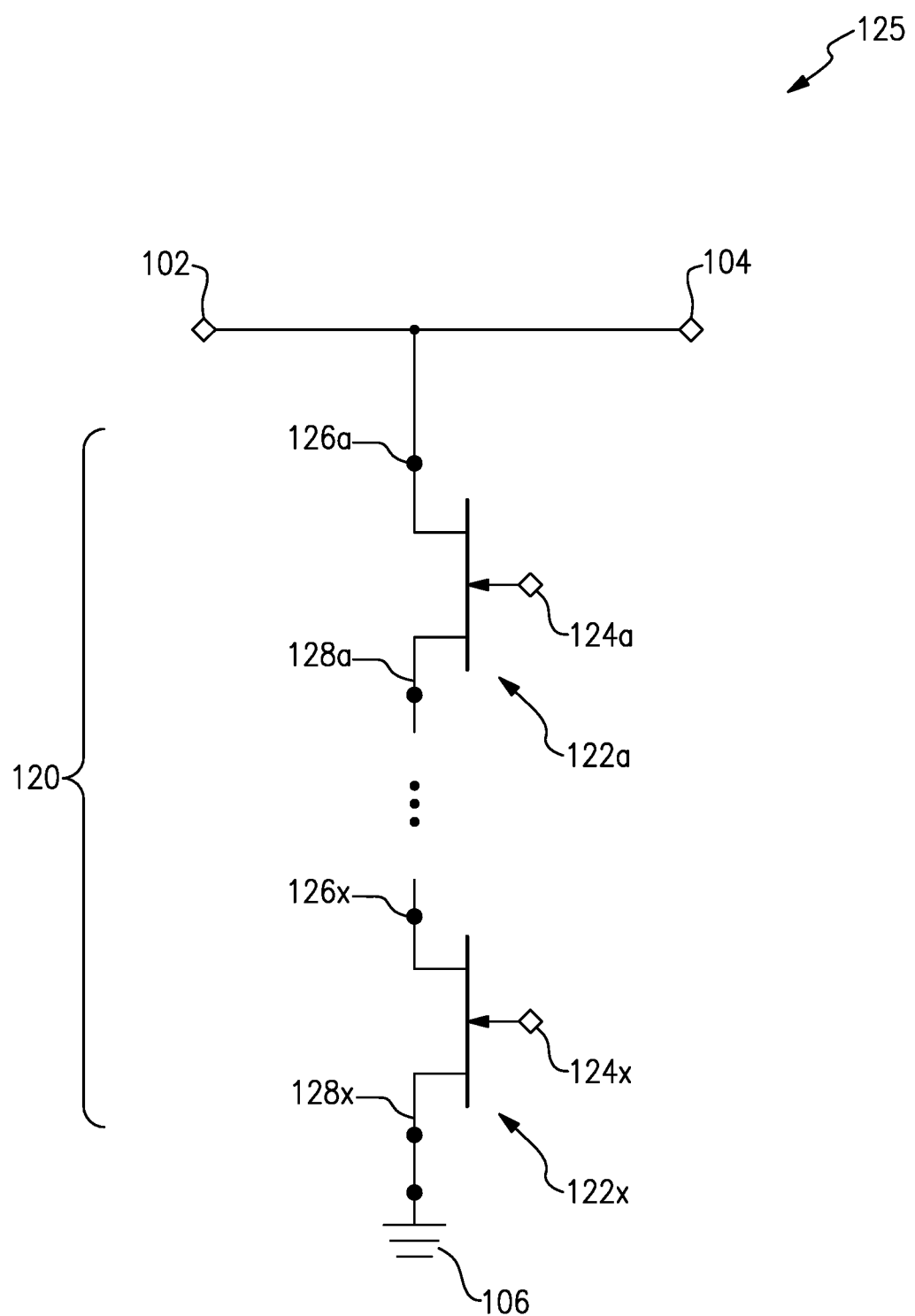
FIG. 1B is a schematic diagram of an example of a transistor-based switch assembly.

FIG. 1B illustrates one example of a transistor-based signal switch assembly 125 including a shunt switch 120 coupled between the signal input 102, the signal output 104, and a reference node 106 (e.g., ground or neutral). In various examples, the signal input 102 and the signal output 104 may be reversible without affecting the component, e.g., the switch 125. In one example, the signal input 102 and/or the signal output 104 of the switch assembly 125 may be coupled to a series switch (e.g., series switch 110 of FIG. 1A). As such, the shunt switch 120 may be configured to shunt signals received at the signal input 102 and/or output 104 when the series switch is non-conducting (off). In some examples, the signal input 102 and/or output 104 of the switch assembly 125 may be coupled to a device (e.g., an amplifier), and the shunt switch 110 may be configured to shunt signals at the input or the output of the device.

In one example, the shunt switch 120 includes a plurality of shunt FETs 122, and each FET of the plurality of shunt FETs 122 has a gate 124, a drain 126, and a source 128. In certain examples, each FET may also have a body contact (not shown). In some examples, the plurality of shunt FETs 122 includes a first FET 122a having a drain 126a coupled to the signal input 102 and signal output 104, and a last FET 122x having a source 128a coupled to the reference node 106. In other examples, the shunt FETs 122 may be arranged differently, for example, the source 128a of the first FET 122a may be coupled to the signal input 102 and the signal output 104, and the drain 126x of the last FET 122x may be coupled to the reference node 106. In some examples, the plurality of shunt FETs 122 may include additional FETs coupled between the first FET 122a and the last FET 122x. For example, the source 128a of the first FET 122a may be coupled to a drain 126b of a second FET 122b, the source 128b of the second FET 122b may be coupled to the drain 126c of a third FET 122c, and so on.

In one example, a control voltage applied to, and received at, the gate 124 of each FET of the plurality of shunt FETs 122 controls the conductivity of a channel between the source 128 and the drain 126 of each FET. In some examples, the gates 124 of the plurality of shunt FETs 122 may be coupled to one another and configured to receive the same control voltage, such that the plurality of shunt FETs 122 may be controlled in unison. In one example, the switch 125 may be operated in an "on state" by controlling the plurality of shunt FETs 122 to be conducting (on) and in the "off state" by controlling the plurality of shunt FETs 122 to be non-conducting (off).

Figure 1C:
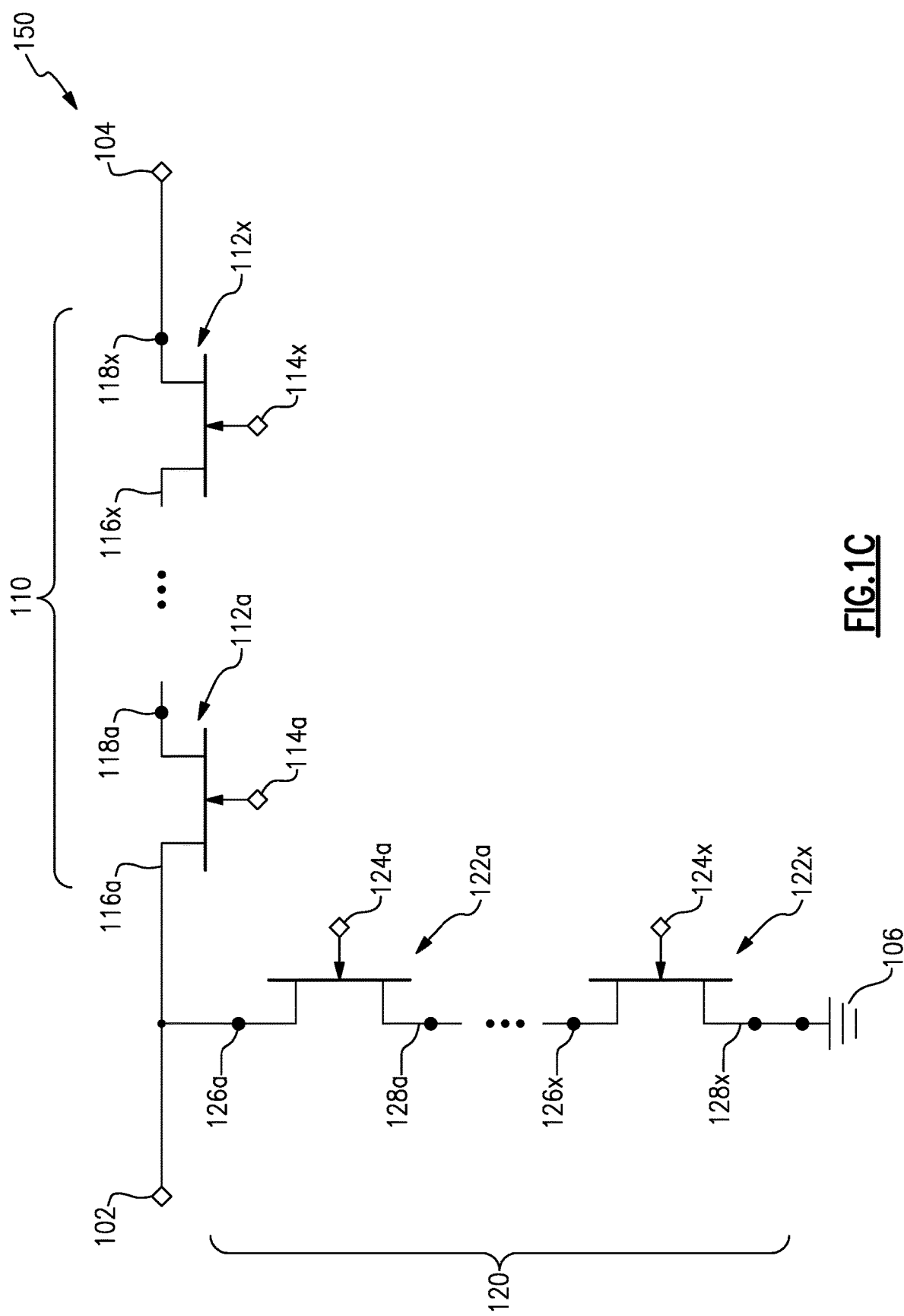
FIG. 1C is a schematic diagram of an example of a transistor-based switch assembly.

FIG. 1C illustrates one example of a transistor-based signal switch assembly 150 including the series switch 110 between the signal input 102 and the signal output 104 and the shunt switch 120 between the signal input 102 and the reference node 106. In other examples, the shunt switch 120 may be included between the signal output 104 and reference node 106. In various examples, the signal input 102 and the signal output 104 may be reversible without affecting the component, e.g., the switch 150.

The switch 150 is controllable to be in an "on state" to conduct a signal received at the signal input 102 and provide the signal to the signal output 104 by controlling the plurality of series FETs 112 to be conducting (on) and controlling the plurality of shunt FETs 122 to be non-conducting (off) by applying appropriate control voltages to each of the gates 114, 124. Likewise, the switch 150 is controllable to be in an "off state" to substantially block signals received at the signal input 102 by controlling the plurality of series FETs 112 to be non-conducting (off) and controlling the plurality of shunt FETs 122 to be conducting (on) by applying appropriate control voltages to each of the gates 114, 124. In such an off state, the switch 150 prevents signals from passing through to the signal output 104, at least in part due to the plurality of series FETs 112 presenting a (capacitive) open circuit between the input 102 and the output 104, and the plurality of shunt FETs 122 providing a conducting signal path to the reference node 106, substantially diverting the signal received at the signal input 102.

The FETs of the plurality of series FETs 112 and the plurality of shunt FETs 122 in the examples described above may each be one of many types of FETs known in the art. For example, each may be a junction FET (JFET), a metal oxide semiconductor FET (MOSFET), or a silicon on insulator (SOI) MOSFET, and may be of N-channel or P-channel types, and enhancement or depletion mode types. In other examples, each FET may be a gallium arsenide (GaAs) FET, a gallium nitride (GaN) FET, or another type of FET.

As discussed above, the gates 114 of the plurality of series FETs 112 may be coupled together such that the plurality of series FETs 112 may be controlled (e.g., turned on and off) in unison. Similarly, the gates 124 of the plurality of shunt FETs 122 may be coupled together such that the plurality of shunt FETs 122 may be controlled (e.g., turned on and off) in unison. In some examples, control voltages may be applied to the gates 114, 124 through one or more gate resistors.

In many RF applications, it is desirable for transistor-based signal switches to have high off resistances and fast switching times. In one example, the off resistance ($R_{off}$) of a transistor-based signal switch may correspond to the total resistance seen by an RF signal applied to an input of the RF switch while the switch is turned off (i.e. open). In some examples, gate resistors can affect the value of $R_{off}$ of transistor-based signal switches (e.g., switches 100, 125, and 150). For example, the $R_{off}$ of each switch may be proportional to the values of the gate resistors; i.e., higher valued gate resistors may contribute to a higher $R_{off}$ and lower valued gate resistors may contribute to a lower $R_{off}$. In some examples, the switching time of each switch may correspond to the values of the gate resistors. For example, higher valued gate resistors may correspond, at least in part, to slower switching times and lower valued gate resistors may correspond to faster switching times.

An improved transistor-based signal switch is provided herein. In at least one embodiment, the transistor-based signal switch may have an optimized distribution of gate resistances to improve switching speed. In some examples, the optimized distribution of gate resistances may also increase the power handling capability of the switch and reduce the switch footprint.

Figure 2A:
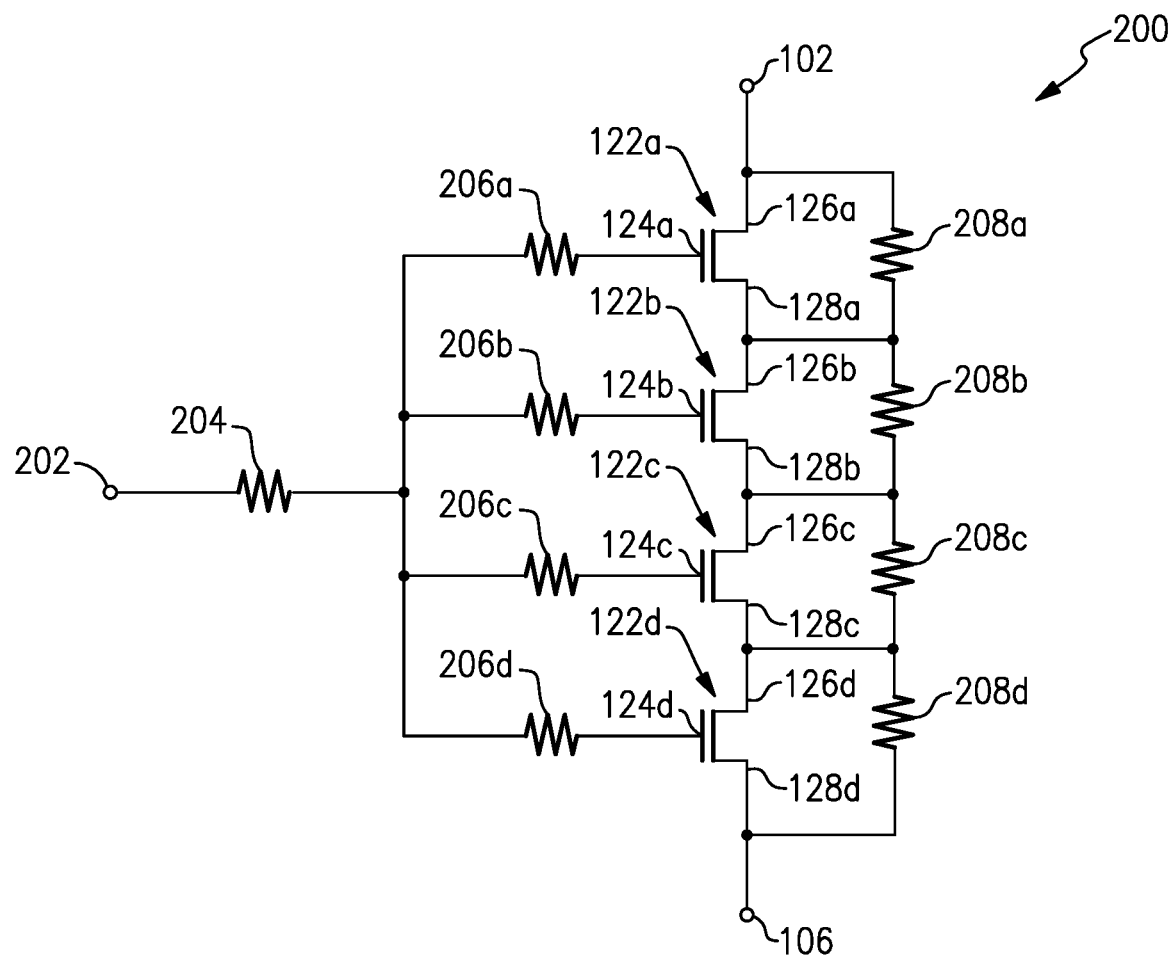
FIG. 2A is a schematic diagram of an example of a transistor-based signal switch.

FIG. 2A illustrates one example of a transistor-based signal switch 200. In one example, the switch 200 may be substantially similar to the shunt switch 120 of FIGS. 1B and 1C, except that the switch 200 includes a gate control input 202 and a common resistor 204 coupled between the gate control input 202 and a plurality of gate resistors 206.

In one example, the plurality of FETs 122 of the switch 200 includes a first FET 122a, a second FET 122b, a third FET 122c, and a fourth FET 122d coupled between the signal input 102 and the reference node 106. In other examples, the plurality of FETs 122 may include a different number of FETs. As shown in FIG. 2A, a first gate resistor 206a may be coupled between the common resistor 204 and a gate 124a of the first FET 122a, a second gate resistor 206b may be coupled between the common resistor 204 and a gate 124b of the second FET 122b, a third gate resistor 206c may be coupled between the common resistor 204 and a gate 124c of the third FET 122c, and a fourth gate resistor 206d may be coupled between the common resistor 204 and a gate 124d of the fourth FET 122d.

In some examples, the switch 200 may include a plurality of drain-source resistors 208 coupled in parallel with the plurality of FETs 122 (i.e., with each drain-source resistor coupled between the drain and the source of a respective FET 122). For example, a first drain-source resistor 208a may be coupled in parallel with the first FET 122a, a second drain-source resistor 208b may be coupled in parallel with the second FET 122b, a third drain-source resistor 208c may be coupled in parallel with the third FET 122c, and a fourth drain-source resistor 208d may be coupled in parallel with the fourth FET 122d. In one example, each resistor of the plurality of drain-source resistors 208 may have substantially the same value; however, in other examples, at least one of the resistors may have a different value.

In certain examples, the switch 200 may be configured to operate in an "on state" by turning on each FET of the plurality of FETs 122. In one example, when turned on, each FET of the plurality of FETs 122 may provide a conductive signal path having a drain-to-source resistance ($R_{on}$). In some examples, the $R_{on}$ of each FET may be substantially smaller than the value of the corresponding drain-source resistor $R_{ds}$ (e.g., 208a, 208b, etc.). As such, in the on state of the switch 200, the drain-source resistors 208 may be bypassed to provide a signal path from the signal input 102, through the plurality of FETs 122, to the reference node 106 (i.e., ground). Likewise, the switch 200 may be configured to operate in an "off state" by turning off the plurality of FETs 122 to disconnect the signal path between the signal input 102 and the reference node 106.

In one example, a control signal may be provided from the gate control input 202, through the common resistor 204 and the plurality of gate resistors 206 to turn on each FET of the plurality of FETs 122. In some examples, to turn on each FET of the plurality of FETs 122, the gate voltage of each FET must be raised above a gate threshold voltage by charging a gate capacitance. In one example, the gate capacitance of each FET includes a gate-to-drain capacitance, a gate-to-source capacitance, and a gate-to-body capacitance. Once the gate capacitance of a FET is charged, the gate voltage may exceed the gate threshold voltage, turning the FET on. Likewise, to turn off each FET of the plurality of FETs 122, the gate voltage of each FET must be lowered below the gate threshold voltage by discharging the gate capacitance.

Figure 2B:
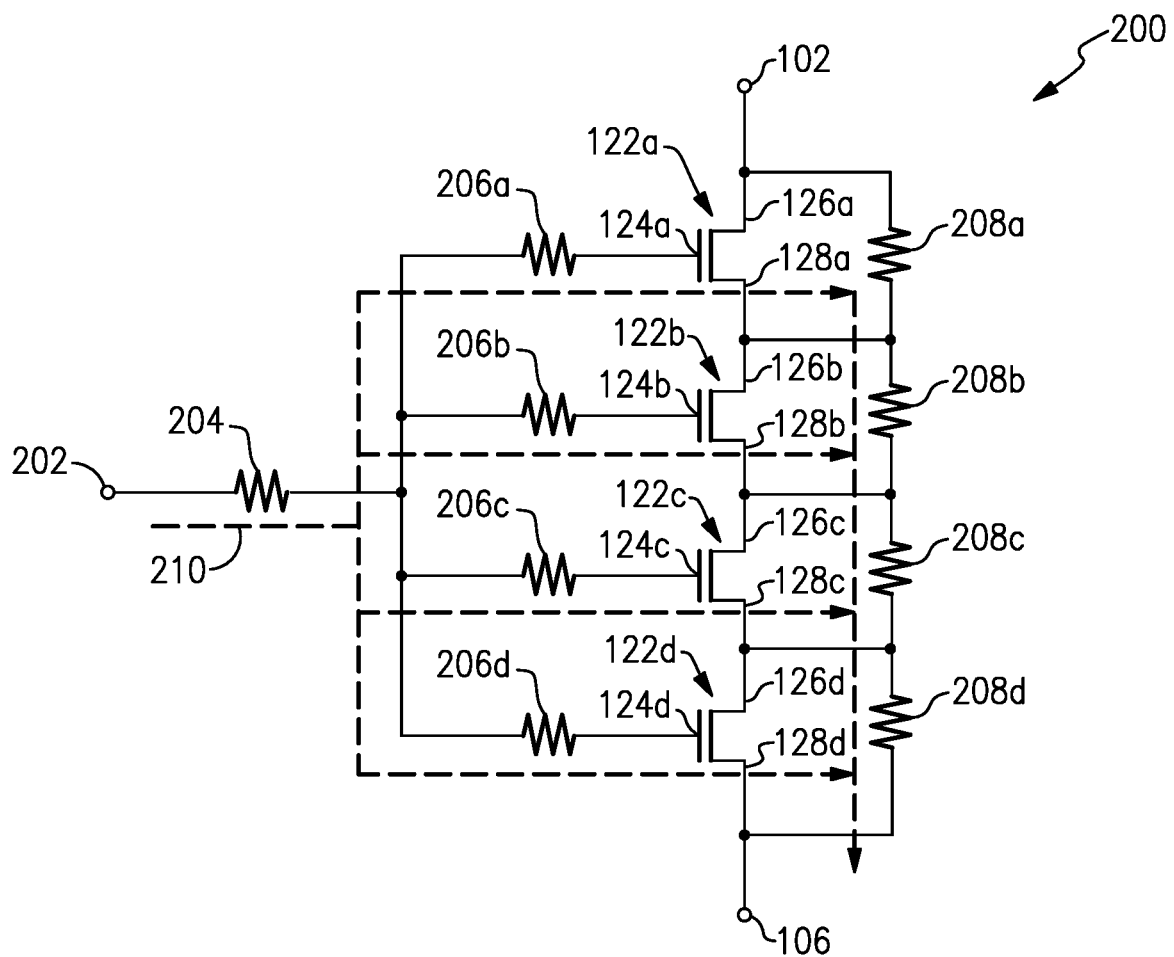
FIG. 2B is a schematic diagram of an example of a transistor-based signal switch.

FIG. 2B illustrates the control operation of the switch 200. As shown, to turn on the switch 200, a control signal 210 may be applied at the gate control input 202. The control signal 210 is applied to each gate 124 of the plurality of FETs 122 via the common resistor 204 and the plurality of gate resistors 206. In one example, current corresponding to the control signal 210 may be provided through the common resistor 204 and the current may be divided into portions and provided to the gates 124 via the individual gate resistors (i.e., 206a, 206b, etc.). As discussed above, each FET of the plurality of FETs 122 may be turned on by charging the corresponding gate capacitance (e.g., a gate-to-drain capacitance, a gate-to-source capacitance, and/or a gate-to-body capacitance). In some examples, the turn-on time of each FET may correspond to an RC time constant defined, at least in part, by the common resistor 204, the corresponding gate resistor (e.g., 206a, 206b, etc.), the corresponding gate capacitance, and the plurality drain-to-source resistors 208. As such, each FET of the plurality of FETs 122 may experience a different turn-on time (i.e., a different RC time constant).

In one example, the turn-on time of each FET may depend on the FET's position in the plurality of FETs 122. For example, the RC time constant associated with the first FET 122a may include the entire plurality of drain-to-source resistors 208 and the RC time constant associated with the fourth FET 122d may only include the fourth drain-source resistor 208d. As such, the RC time constant associated with the first FET 122a may be larger than the RC time constant associated with the fourth FET 122d, and the first FET 122a may have a longer turn-on time than the fourth FET 122d (assuming the signal input 102 is connected to a fairly high impedance at a low frequency (such as a capacitor, an "off" FET, or a high value resistor) and the reference node 106 is connected to a fairly low impedance (such as a ground node, an inductor connected to ground, or a series of "on" FETs or switches connected to ground)). Likewise, when the signal input 102 and the reference node 106 are both connected to substantially similar impedances (e.g., in value or order of magnitude), the center FETs (e.g., 122b, 122c) may have longer turn-on times than the first and fourth FETs 122a, 122d.

In some examples, to turn off the switch 200, the gate capacitance of each FET of the plurality of FETs 122 may be discharged. In one example, current may discharge from each FET via the corresponding gate resistor (i.e., 206a, 206b, etc.) and the common resistor 204. In certain examples, the turn-off time of each FET may correspond to the RC time constants discussed above. As such, each FET of the plurality of FETs 122 may experience a different turn-off time. In some examples, the turn-off time of each FET may also depend on the FETs position in the plurality of FETs 122.

In one example, the switch 200 may be configured to distribute an RF voltage applied at the signal input 102 across the plurality of FETs 122 during the off state. In some examples, the elements of the switch 200 may function as a voltage divider to distribute the RF voltage across the plurality of FETs 122. For example, the plurality of gate resistors 206, the plurality of drain-source resistors 208, and the parasitic capacitances of the plurality of FETs 122 (e.g., parasitic gate capacitance, drain-to-source capacitance, etc.) may each contribute to the distribution of the RF voltage across the plurality of FETs 122. In some examples, each FET of the plurality of FETs 122 may have substantially similar parasitic capacitances. As such, the values of the plurality of gate resistors 206 and the plurality of drain-source resistors 208 may be selected to achieve a desired voltage distribution for the switch 200. In one example, the desired voltage distribution may be a substantially even distribution across each FET of the plurality of FETs 122; however, in other examples a different voltage distribution may be desired. In some examples, the desired voltage distribution may be selected to prevent the plurality of FETs 122 from entering a breakdown region.

As described above, it may be desirable for RF switches to have a large off resistance ($R_{off}$), and the values of the plurality of gate resistors 206 may contribute to establishing the value of $R_{off}$. In one example, each of the plurality of gate resistors 206 may dissipate a portion of the RF voltage applied to the signal input 102 in the off state of the switch 200. In some examples, the portions of the RF voltage dissipated by each of the plurality of gate resistors 206 may depend on the voltage distribution of the switch described above. As such, power dissipation may be taken into consideration when selecting values for the plurality of gate resistors 206 to manage loss in the switch 200.

Figure 2C:
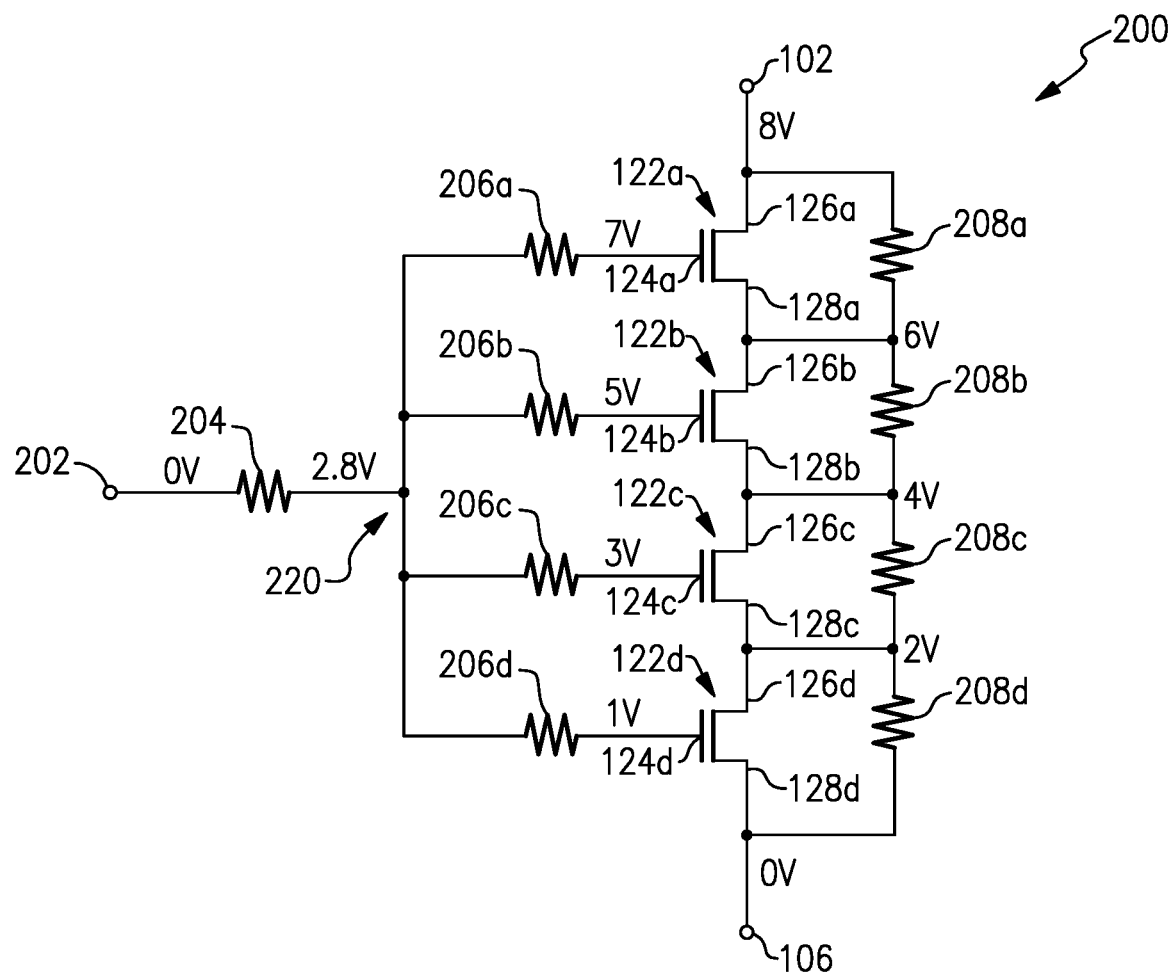
FIG. 2C is a schematic diagram of an example of a transistor-based signal switch.

FIG. 2C illustrates the switch 200 while turned off. In one example, an RF voltage (e.g. 8V) is applied at the signal input 102 and distributed evenly across the plurality of FETs 122. As shown, substantially similar portions of the RF voltage (e.g., 2V) may be distributed across each FET of the plurality of FETs 122. In one example, based on the voltage distribution of the switch 200, a portion of the RF voltage may be present at a common node 220 between each of the plurality of gate resistors 206 and the common resistor 204. In some examples, the power dissipated by each of the plurality of gate resistors 206 may be determined, at least in part, by the voltage differential between each gate 124 of the plurality of FETs 122 and the common node 220. As such, the voltage differential between each gate 124 of the plurality of FETs 122 may depend on the corresponding FETs position in the plurality of FETs 122. For example, the power dissipated by the first gate resistor 206a may correspond to the voltage differential between the gate 124a of the first FET 122a and the common node 220 (e.g. 4.2V). Similarly, the power dissipated by the third gate resistor 206c may correspond to the difference between the voltage at the gate 124c of the third FET 122c (e.g., 3V) and the voltage at the common node 220 (e.g., 2.8V). Being that the voltage differential between the gate 124c of the third FET 124c and the common node 220 is relatively small (e.g., 0.2V), the power dissipated by the third gate resistor 206c is also relatively small. As such, the value of the third gate resistor 206c may be reduced. In some examples, as a result of reducing the value of the third gate resistor 206c, the values of the other gate resistors (i.e., 206a, 206b, 206d) may be adjusted (e.g., increased) to provide an optimally scaled arrangement of gate resistor values. In some examples, the value of the common resistor 204 may also be reduced in accordance with the scaled arrangement of gate resistor values.

Figure 3A:
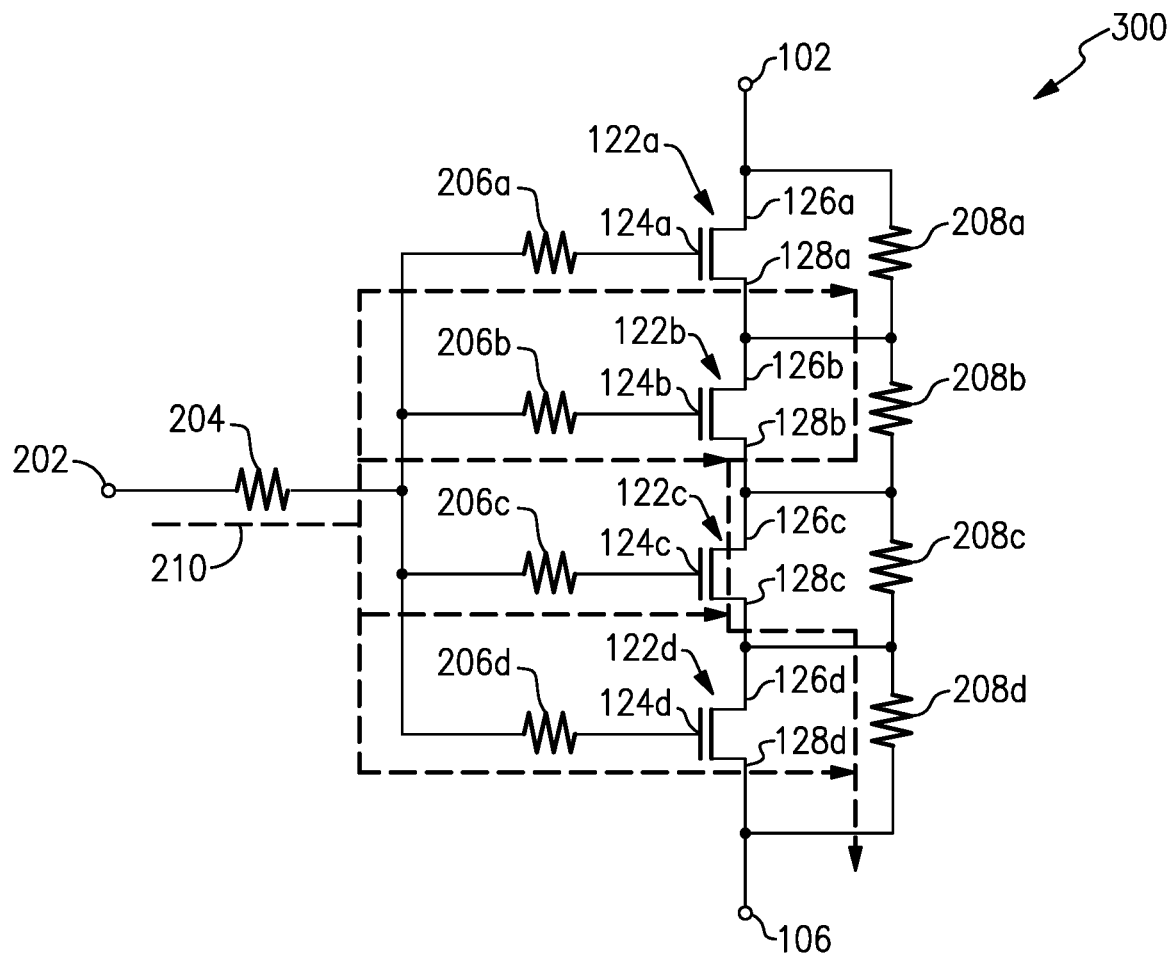
FIG. 3A is a schematic diagram of a transistor-based signal switch in accordance with one embodiment.

FIG. 3A illustrates an example of a transistor-based signal switch 300. In one example, the switch 300 may be substantially the same as the switch 200 discussed above, except the value of the third gate resistor 206c is lower than the first, second, and fourth gate resistors 206a, 206b, and 206d. It should be appreciated that the value of any one of the plurality of gate resistors 206 may be reduced with respect to the values of the other gate resistors in other examples. The third gate resistor 206c has merely been selected here for demonstrative purposes based on the example voltage distribution of the switch 200 described above.

As shown in FIG. 3A, the control signal 210 may be provided from the gate control input 202, through the common resistor 204 and the plurality of gate resistors 206 to turn on each FET of the plurality of FETs 122. As described above, the turn-on time of each FET may correspond to an RC time constant defined by the common resistor 204, the corresponding gate resistor (e.g., 206a, 206b, etc.), the corresponding gate capacitance, and the plurality drain-to-source resistors 208. Being that the value of the third gate resistor 206c is lower than the values of the other gate resistors, the RC time constant corresponding to the third FET 122c may be smaller than the RC time constants of at least a portion of the other FETs. As such, the turn-on time of the third FET 122c may be reduced relative to the turn on time of the other FETs (e.g., 122a, 122b, etc.).

As described above, when turned on, each FET of the plurality of FETs 122 may provide a conductive signal path having a drain-to-source resistance $R_{on}$ that is lower than its corresponding drain-source resistor $R_{ds}$ (i.e., 208a, 208b, etc.). As shown in FIG. 3A, once the third FET 122c has turned on, the drain-source resistor 208c may be bypassed by the conductive signal path of the third FET 122c. As such, the effective resistance between the signal input 102 and the reference node 106 decreases, allowing the gate capacitances of the FETs 122a, 122b, and 122d to charge faster through the corresponding gate resistors (i.e., 206a, 206b, and 206d) and the common resistor 204. As a result, the turn-on time of the switch 300 may be reduced. In examples having a reduced common resistor 204, the turn-on time of the switch 300 may be further reduced.

Figure 3B:
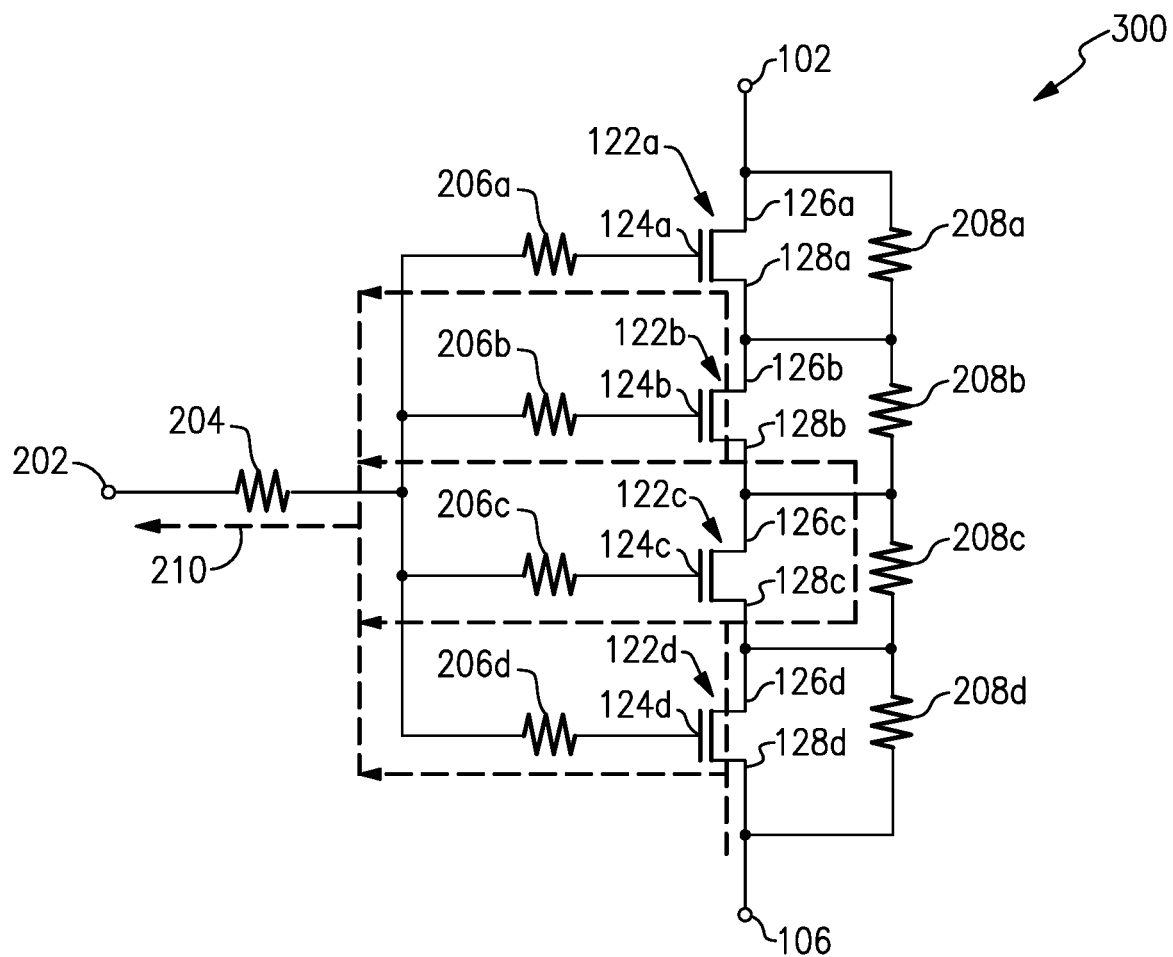
FIG. 3B is a schematic diagram of a transistor-based signal switch in accordance with one embodiment.

As shown in FIG. 3B, to turn off the switch 300, the gate capacitance of each FET of the plurality of FETs 122 may be discharged. In one example, current may discharge from each FET via the corresponding gate resistor (i.e., 206a, 206b, etc.) and the common resistor 204. In some examples, the turn-off time of each FET may be dependent on the RC time constants discussed above. Being that the RC time constant corresponding to the third FET 122c is smaller than the RC time constants of at least a portion of the other FETs, the turn-off time of the third FET 122c may be reduced relative to the other FETs. Once the third FET 122c is turned off, the third drain-source resistor 208c is no longer bypassed by the conductive signal path (i.e., $R_{on}$) of the third FET 122c. As such, the effective resistance between the signal input 102 and the reference node 106 increases, allowing the gate capacitances of the FETs 122a, 122b, and 122d to discharge faster through the corresponding gate resistors (i.e., 206a, 206b, and 206d) and the common resistor 204. As a result, the turn-off time of the switch 300 may be reduced. In examples having a reduced common resistor 204, the turn-off time of the switch 300 may be further reduced.

In some examples, in addition to improving switching speed, providing an optimally scaled arrangement of gate resistances as described above may reduce the footprint of the switch 300. For example, reducing the value of at least one gate resistor (e.g., 206c) may correspond to a smaller resistor package(s). In certain examples, the optimally scaled arrangement of gate resistances described above may improve the power handling capability of the switch 300. For example, by reducing the value(s) of the gate resistors corresponding to low RF power dissipation, the value(s) of the gate resistors corresponding to high RF power dissipation may be increased while maintaining the improved switch performance described above (e.g., switching speed). As such, in some examples, the power handling capability of the switch 300 may be increased.

An example of a scaled arrangement of gate resistances is illustrated in Tables 1 and 2 below for a switch 300 having fourteen FETs coupled in series between a signal input 102 and a reference node 106:

TABLE 1

| Vgate (V) | Rcom | A<br>20 | B<br>5 |
|---|---|---|---|
| 0.964286 | R14 | 80 | 220 |
| 0.892857 | R13 | 80 | 190 |
| 0.821429 | R12 | 80 | 170 |
| 0.75 | R11 | 80 | 140 |
| 0.678571 | R10 | 80 | 120 |
| 0.607143 | R9 | 80 | 110 |
| 0.535714 | R8 | 80 | 90 |
| 0.464286 | R7 | 80 | 80 |

TABLE 1-continued

| Vgate (V) | Rcom | A 20 | B 5 |
|---|---|---|---|
| 0.392857 | R6 | 80 | 70 |
| 0.321429 | R5 | 80 | 60 |
| 0.25 | R4 | 80 | 50 |
| 0.178571 | R3 | 80 | 30 |
| 0.107143 | R2 | 80 | 50 |
| 0.035714 | R1 | 80 | 100 |
|  | VA | 0.388889 | 0.017618 |

TABLE 2

|  | A | B |
|---|---|---|
| PD14 | 4.1 | 2.8 |
| PD13 | 3.2 | 2.7 |
| PD12 | 2.3 | 2.4 |
| PD11 | 1.6 | 2.4 |
| PD10 | 1.0 | 2.1 |
| PD9 | 0.6 | 1.7 |
| PD8 | 0.3 | 1.4 |
| PD7 | 0.1 | 1.0 |
| PD6 | 0.0 | 0.7 |
| PD5 | 0.1 | 0.4 |
| PD4 | 0.2 | 0.1 |
| PD3 | 0.6 | 0.0 |
| PD2 | 1.0 | 0.1 |
| PD1 | 1.6 | 0.2 |
| Ptotal | 24.2 | 24.2 |
| Rg_OFF | 41.3 | 41.3 |

In Table 1, column A corresponds to gate resistor values (in kΩ) of a transistor-based signal switch having an equal arrangement of gate resistances and column B corresponds to gate resistor values (in kΩ) of a transistor-based switch having a scaled arrangement of gate resistances (e.g., switch 300 of FIGS. 3A, 3B). In one example, the voltage VA in Table 1 may correspond to the voltage at a common node (e.g., common node 220) between the gate resistors and a common resistor Rcom (e.g., common resistor 204). As such, the values of gate resistors having a gate voltage Vgate around the common node voltage VA (e.g., R2-R6) may be reduced. In some examples, the values of gate resistors may be reduced up to 60% (e.g., R3); however, in other examples the gate resistors may be reduced by different amounts. Likewise, the values of the gate resistors corresponding to gate voltages higher or lower than VA (e.g., R1, R8-R14) may be increased. In some examples, the values of the gate resistors may be increased by approximately 175% (e.g., R14); however, in other examples the gate resistors may be increased by different amounts. Likewise, the value of the common resistor may be reduced by approximately 75% (e.g., Rcom). As shown in Table 2, the power dissipated (PD) by the gate resistors in column A (i.e., equal arrangement) and the gate resistors in column B (i.e., scaled arrangement) may be similar, and the overall power dissipation Ptotal for each switch may be substantially the same. In some examples, being that the overall power dissipation Ptotal for each switch is substantially the same, the power dissipation (i.e., loss) and off resistances ($R_{off}$) of the switches may also be substantially the same. As such, the scaled arrangements of gate resistances described herein may provide improved switching speed while maintaining desired amounts of switch power dissipation and off resistance ($R_{off}$).

Figure 4B:
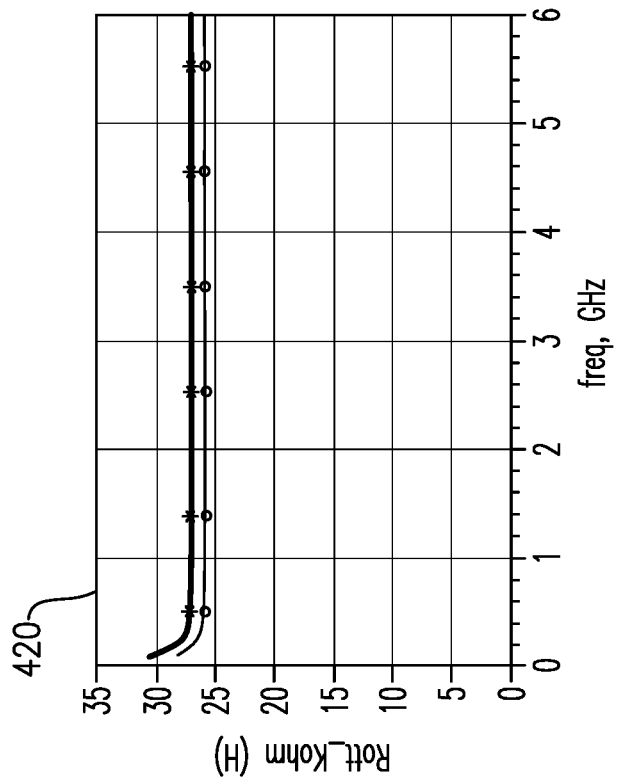
FIG. 4B is a graph illustrating simulated performance characteristics for examples of transistor-based signal switches in accordance with one embodiment.
Figure 4A:
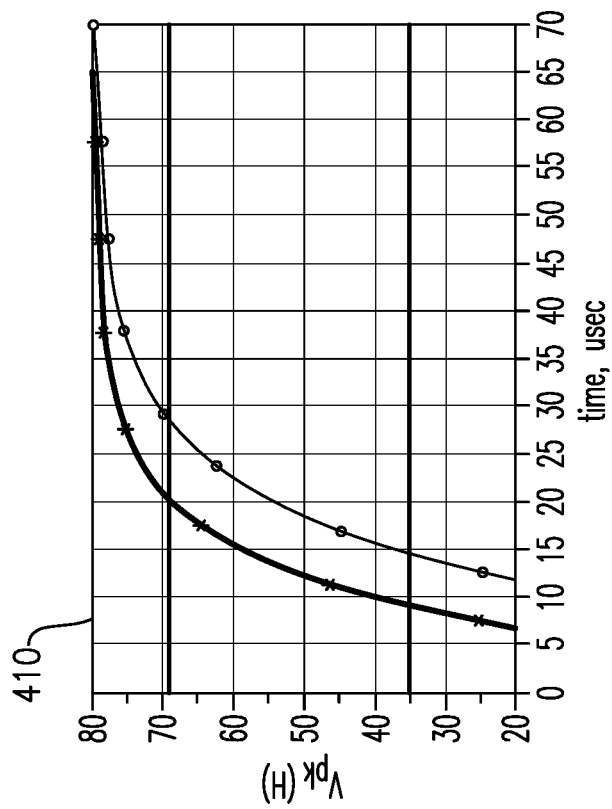
FIG. 4A is a graph illustrating simulated performance characteristics for examples of transistor-based signal switches in accordance with one embodiment.

FIGS. 4A and 4B illustrate a number of simulated performance results of transistor-based signal switches. In one example, the graphs include performance results for a first transistor-based signal switch having an equal arrangement of gate resistances (e.g., column A of Table 1) and a second transistor-based signal switch having a scaled arrangement of gate resistances and a reduced common resistor (e.g., switch 300). Each set of graphs is coded to indicate the performance is for the first switch ('o') and the second switch ('*').

The graph 410 of FIG. 4A illustrates a plot comparing settling time (in usec) of the switches when both sides (e.g., the signal input 102 and the reference node 106) are grounded or connected to a low impedance. The graph 420 of FIG. 4B illustrates a plot comparing $R_{off}$ (in kΩ) of the switches across frequency. As shown in the graph 410, when both sides of the switches are grounded, the second switch (i.e., scaled gate resistor arrangement) may experience a 20-30% reduction in settling time compared to the first switch (i.e., equal gate resistor arrangement). As such, the switching speed of switches having the scaled arrangements of gate resistances may be improved compared to switches having the equal gate resistance arrangement. As shown in the graph 420, the off resistance ($R_{off}$) may be substantially the same for each of the switches.

Embodiments of the transistor-based signal switch 300 as described herein can be implemented in a variety of different modules and assemblies including, for example, the switch 120 of switch assemblies 125, 150 (FIGS. 1B, 1C), a stand-alone RF switch assembly, an RF front-end module, an antenna tuning module, a module combining the switch 300 with a power amplifier, or the like.

Modules may include a substrate and may include various dies and may include packaging, such as, for example, an overmold to provide protection and facilitate easier handling. An overmold may be formed over a substrate and dimensioned to substantially encapsulate the various dies and components thereon. The module may further include connectivity from the transistor-based signal switch 300 to the exterior of the packaging to provide signal interconnections, such as input port connections (e.g., signal input 102), output port connections (e.g., signal output 104), reference port connections (e.g., reference node 106), control input connections (e.g., gate control input 202), etc. Certain examples may have multiple connections to accommodate access to various individual components in the module. The various connections may be provided in part by wire bonds or solder bumps, for example, and may include multiple electrical connections where appropriate.

Embodiments of the transistor-based signal switch 300 disclosed herein, optionally packaged into a module, may be advantageously used in a variety of electronic devices. General examples of an electronic device may include a circuit board having numerous modules mounted thereon. The circuit board may have multiple layers and may include circuit elements and interconnections in the layers and/or mounted on the surface of the circuit board. Each of the modules may have a multi-layer substrate within and upon which there may also be various circuit elements and interconnections. Additionally, the modules may further include dies, each of which may have multiple layers and include various circuit elements and interconnections. A transistor-based signal switch in accord with aspects and embodiments disclosed herein may be implemented within, among, or across any of the layers of the various structures, e.g., circuit board, substrates, and dies, as part of an electronic device, such as a cell phone, tablet, laptop computer, smart device, router, cable modem, wireless access point, etc.

As described above, an improved transistor-based signal switch is provided herein. In at least one embodiment, the transistor-based signal switch may have an optimized distribution of gate resistances to improve switching speed. In some examples, the optimized distribution of gate resistances may also increase the power handling capability of the switch and reduce the switch footprint. As such, aspects and embodiments of the RF switch assembly described above may be advantageously used in wireless devices to support, for example, 3G, 4G, LTE, and 5G wireless communications.

What is claimed is:

1. A switch for a radio frequency signal switch assembly comprising:
    a first node coupled to one of an input and an output of the switch assembly and a second node coupled to a reference voltage;
    a control node;
    a common resistor coupled to the control node;
    a plurality of transistors coupled between the first and second nodes, each transistor of the plurality of transistors having a gate, a drain, and a source; and
    a plurality of gate resistors coupled between the common resistor and the gates of the plurality of transistors, respectively, the plurality of gate resistors having a non-equal scaled arrangement of values selected based on a voltage differential across each of the plurality of gate resistors to improve switching speed.

2. The switch of claim 1 wherein a control signal received by the control node is applied to the gates of the plurality of transistors through the common resistor and the plurality of gate resistors.

3. The switch of claim 2 wherein the control signal is configured to operate the switch in an on state by turning on each of the plurality of transistors such that an RF signal received at the first node is provided to the second node.

4. The switch of claim 3 wherein the control signal is configured to operate the switch in an off state by turning off each of the plurality of transistors such that the RF signal received at the first node is not provided to the second node.

5. The switch of claim 4 further comprising a plurality of drain-source resistors, each drain-source resistor being coupled between the drain and source of a corresponding transistor of the plurality of transistors.

6. The switch of claim 5 wherein the voltage differential across each of the plurality of gate resistors is based on a voltage distribution of the RF signal received at the first node during the off state, the voltage distribution being determined, at least in part, by the plurality of gate resistors and the plurality of drain resistors.

7. The switch of claim 6 wherein the values of the gate resistors corresponding to the lowest voltage differentials are smaller than the values of the gate resistors corresponding to highest voltage differentials.

8. The switch of claim 7 wherein a first gate resistor of the plurality of gate resistors corresponding to the lowest voltage differential has a smaller value than the other gate resistors of the plurality of gate resistors.

9. The switch of claim 8 wherein a first transistor of the plurality of transistors corresponding to the first gate resistor turns on and/or off faster than at least one second transistor of the plurality of transistors.

10. The switch of claim 9 wherein the first transistor turning on and/or off faster than the at least one second transistor allows the at least one second transistor to turn on and/or off faster to improve the switching speed of the switch.

11. A radio frequency signal switch assembly comprising:
    a signal input and a signal output;
    a reference node configured to be coupled to a reference voltage;
    a control input configured to receive a control signal;
    a common resistor coupled to the control input;
    a first switch including a first plurality of transistors coupled between the signal input and the signal output, each transistor of the plurality of first transistors having a gate, a drain, and a source;
    a second switch including a second plurality of transistors coupled between the reference node and one of the signal input and the signal output, each transistor of the plurality of second transistors having a gate, a drain, and a source; and
    a plurality of gate resistors coupled between the common resistor and the gates of the second plurality of transistors, respectively, the plurality of gate resistors having a non-equal scaled arrangement of values selected based on a voltage differential across each of the plurality of gate resistors to improve switching speed.

12. The switch assembly of claim 11 wherein the control signal received at the control input is applied to the gates of the second plurality of transistors through the common resistor and the plurality of gate resistors.

13. The switch assembly of claim 12 wherein the control signal is configured to operate the switch assembly in an on state by turning off the second plurality of transistors of the second switch such that an RF signal received at one of the signal input and the signal output is not provided to the reference node while the first plurality of transistors of the first switch are turned on.

14. The switch assembly of claim 13 wherein the control signal is configured to operate the switch assembly in an off state by turning on the second plurality of transistors of the second switch such that an RF signal received at one of the signal input and the signal output is provided to the reference node while the first plurality of transistors of the first switch are turned off.

15. The switch assembly of claim 14 further comprising a plurality of drain-source resistors, each drain-source resistor being coupled between the drain and source of a corresponding transistor of the second plurality of transistors.

16. The switch assembly of claim 15 wherein the voltage differential across each of the plurality of gate resistors is based on a voltage distribution of the RF signal received at one of the signal input and the signal output during the on state of the switch assembly, the voltage distribution being determined, at least in part, by the plurality of gate resistors and the plurality of drain-source resistors.

17. The switch assembly of claim 16 wherein a first gate resistor of the plurality of gate resistors corresponding to the lowest voltage differential has a smaller value than the other gate resistors of the plurality of gate resistors.

18. The switch assembly of claim 17 wherein a first transistor of the second plurality of transistors corresponding to the first gate resistor turns on and/or off faster than at least one second transistor of the second plurality of transistors.

19. A method of designing a switch for a radio frequency signal switch assembly comprising:
    arranging a plurality of transistors between a first node coupled to one of an input and an output of the switch assembly and a second node coupled to a reference voltage, each transistor of the plurality of transistors having a gate, a drain, and a source;
    selecting a common resistor to be coupled to a control node; and selecting a plurality of gate resistors to be coupled between the common resistor and the gates of the plurality of transistors, respectively, the plurality of gate resistors having a non-equal scaled arrangement of values selected based on a voltage differential across each of the plurality of gate resistors to improve switching speed.

20. The method of claim 19 wherein selecting the plurality of gate resistors based on the voltage differential across each of the plurality of gate resistors includes determining a voltage distribution of an RF signal received at the first node and scaling the plurality of gate resistors based on the voltage distribution of the RF signal.

\* \* \* \* \*